United States Patent [19]

Bowyer et al.

[11] 4,399,752

[45] Aug. 23, 1983

[54] SOLID STATE SWITCH

[75] Inventors: John M. Bowyer, Copley; George W. Flower, Tallmadge; Edward M. Maluke, Hartville, all of Ohio

[73] Assignee: Goodyear Aerospace Corporation, Akron, Ohio

[21] Appl. No.: 263,970

[22] Filed: May 18, 1981

[51] Int. Cl.³ .......................................... F42C 11/00
[52] U.S. Cl. .................................................. 102/217
[58] Field of Search .............. 102/217, 215, 206, 311, 102/352, 360; 361/249

[56] References Cited

U.S. PATENT DOCUMENTS

| | | | |
|---|---|---|---|
| 2,671,399 | 3/1954 | Morris | 102/217 |
| 3,306,208 | 2/1967 | Bergey et al. | 102/217 |
| 4,135,455 | 1/1979 | Wallace | 102/217 |

Primary Examiner—Charles T. Jordan

Attorney, Agent, or Firm—P. E. Milliken; R. L. Weber; L. A. Germain

[57] ABSTRACT

A solid state switch for electro-explosive devices. Fundamentally, the switch includes a matrix of transformers, each having a center-tap primary winding and a grounded secondary winding, the secondary having a bridge wire connected thereacross. Power gating circuitry is provided for applying a DC voltage to the center-tap primary of all transformers in a selected row. A pair of transistors are connected through diodes to opposite ends of all of the primary windings of the transistors in each column. A driver alternately gates the pair of transistors of a selected column into and out of conduction such that the current through the primary of the transformer common to both the selected row and selected column is of alternating direction, inducing an AC current into the associated secondary winding. The bridge wire of the secondary is thus energized by an AC current.

10 Claims, 1 Drawing Figure

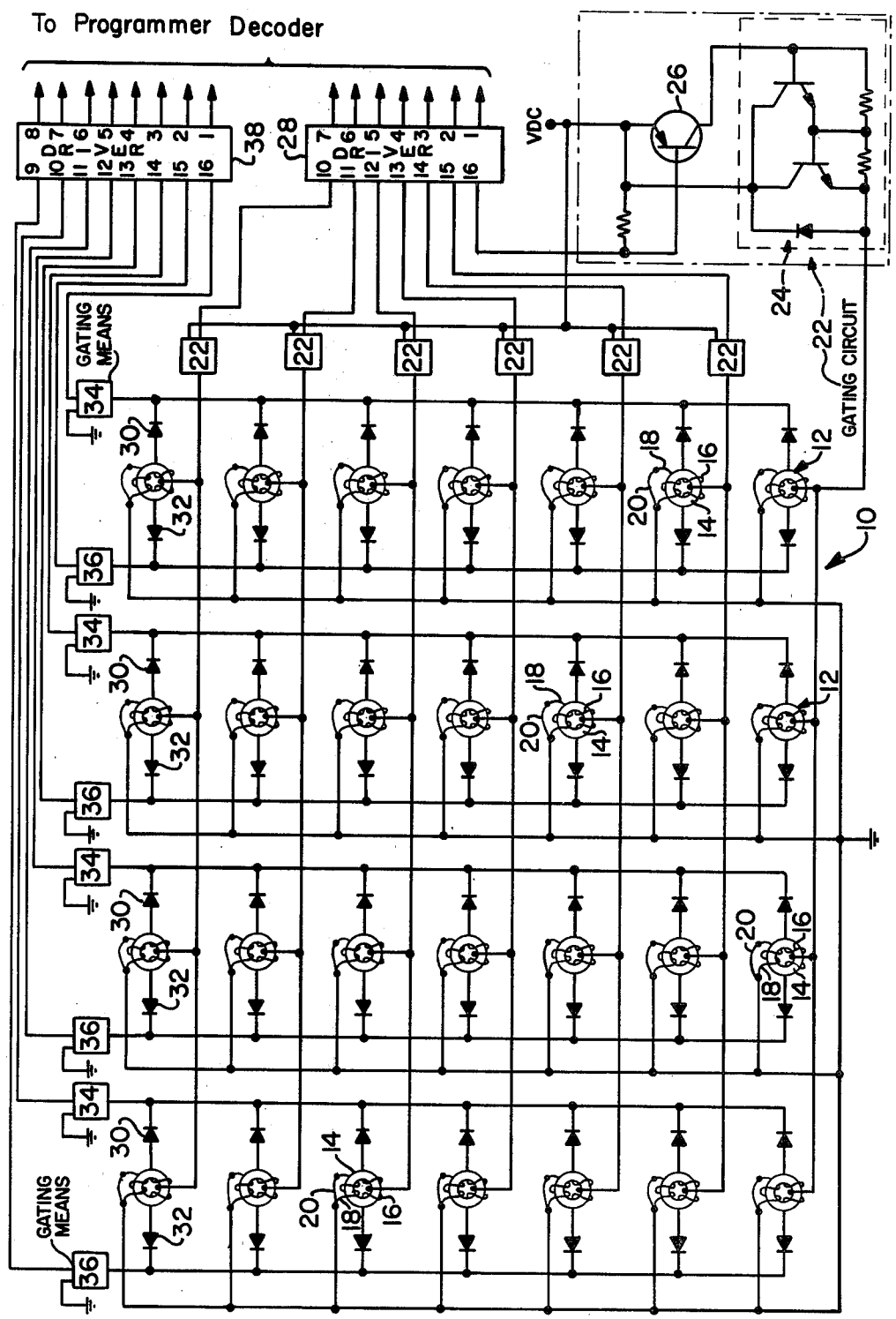

SOLID STATE SWITCH

TECHNICAL FIELD

The invention herein resides in the art of electronic sequencer switches. More particularly, the invention pertains to a solid state switch for actuation of electro-explosive devices.

BACKGROUND ART

Heretofore, military aircraft have typically been provided with countermeasure devices to jam or distract radar, or to sink a missile onto a decoy. The devices for such countermeasures have included radar-jamming chaff, flares for generating heat to attract the guidance system of missiles, and mini-jammers which comprise active transponders. Such countermeasure devices have typically been maintained in a matrix of individual casings or cylinders receiving appropriate chaff, flare, or mini-jammer cartridges.

The countermeasure devices discussed above are actuated by the firing of an electro-explosive device or impulse cartridge uniquely associated with each of the individual cylinders. The electro-explosive device is actuated by a bridge wire which is heated by electrical current passing therethrough. When the bridge wire heats to a predetermined characteristic temperature, it ignites powder which forces the payload of chaff, flare, or mini-jammer out of the associated casing or cylinder. As is presently known in the art, the bridge wire will reach sufficient temperature for igniting the powder upon application of, for example, five amperes for fifty milliseconds.

Previously, firing of the various countermeasure devices from the matrix of the individual cylinder casings was achieved by means of a sequence switch. This switch consisted of a plurality of electromechanical rotary switches driven by solenoids pursuant to the program of a control processor. However, the electromechanical characteristics of the prior art switches gave rise to concern over issues of reliability, weight, packaging, and the like. Further, such switches have associated therewith a characteristically high electromagnetic interferences (EMI) and are rather expensive to produce.

For safety purposes, it is desired that the bridge wire of the electro-explosive device or impulse cartridge be shorted to ground until such time as the device is to be actuated or deployed. At that time, and at that time only, the short to ground would be removed and five amperes of current would be passed through the bridge wire for a fifty millisecond duration. Such shorting, removal of short, and current application are achievable using electromechanical rotary switches, and for that reason such switches have continued in use. However, as previously discussed, such switches have certain inherent drawbacks such as high EMI, cost disadvantages, and reliability problems inherent with electromechanical devices.

DISCLOSURE OF INVENTION

In light of the foregoing, it is an object of a first aspect of the invention to provide a solid state sequencer switch for electro-explosive devices which operates on an AC rather than DC concept.

Another object of an aspect of the invention is to provide a solid state sequencer switch for electro-explosive devices which significantly reduces the presence of EMI over previously known devices.

An additional object of an aspect of the invention is to provide a solid state sequencer switch for electro-explosive devices which allows for continuous grounding of the bridge wires.

Still a further object of an aspect of the invention is to provide a solid state sequencer switch for electro-explosive devices which is inexpensive to construct, lightweight in nature, reliable in operation, and readily implemented with presently existing apparatus.

The foregoing and other objects of the invention which will become apparent as the detailed description proceeds are achieved by a solid state switch, comprising: an array of transformers, each having a center-tapped primary winding; a secondary winding associated with each said transformer in juxtaposition to said primary winding, each said secondary winding having a device for energization connected thereto; first means for applying the voltage source to the primary windings of a first selected group of said transformers; second means for completing the current path through the primary windings of a second selected group of said transformers; and wherein said devices associated with transformers common to both said first and second selected groups are energized.

BRIEF DESCRIPTION OF DRAWING

For a complete understanding of the objects, techniques, and structure of the invention, reference should be had to the following detailed description and accompanying drawing wherein there is presented a circuit schematic of the solid state sequencer switch for electro-explosive devices of the invention.

BEST MODE FOR CARRYING OUT THE INVENTION

Referring now to the drawing, it can be seen that a solid state switch of the invention is designated generally by the numeral 10. The switch includes a matrix of transformers 12 arranged in seven rows by four columns, although it will be appreciated by those skilled in the art that any matrix configuration might be adopted. The transformer 12 includes a core 14 in standard flux-conductive fashion, to provide for inductive communication between a primary winding 16 and a secondary winding 18. An important feature of the invention is that the primary winding 16 is a center-tap winding, with a voltage being applied to the center tap for conduction through the primary winding in a manner to be discussed hereinafter.

The secondary winding 18 of each of the transformers is connected to ground as shown and has connected across the end terminals thereof a bridge wire 20 of a uniquely associated electro-explosive device. It will be appreciated by those skilled in the art that the matrix of transformers 12 corresponds to a matrix of cylinders receiving chaff, flares, and mini-jammers as discussed hereinabove. As a safety feature, the bridge wire 20 of each such cylinder is continuously grounded as by the interconnection of the low impedance secondary windings to ground.

Each of the center taps of the primary windings of the transformers 12 in a given row are commonly connected to a power gating circuit 22. Each circuit 22 includes a Darlington power driver 24 and a gating transistor 26. Of course, a V-MOS or HEX FET could also be used for this purpose. The transistor 26 is gated by a driver 28 under appropriate program and decode control to pass the DC voltage source V through the Darlington 24 and to the center tap of the primary winding of each of the transformers in the associated row. The DC voltage V would typically be twenty-eight volts as is standardly available on most aircraft, although any such DC voltage could be used. As shown, the driver 28 may be appropriately coded to make access through an appropriate power gating circuit 22 to any one of the seven rows of transformers 12 to apply the voltage V at the center tap of the primaries thereof.

The end terminals of the primaries 16 are connected as shown through diodes 30,32 to respectively associated transistors or other gating means 34,36. When the transistor 34 is gated into conduction as by the driver 38, a current path is completed from the center tap of the associated primary windings 16, through the diode 30, to ground at the transistor emitter. Similarly, when the transistor 36 is gated into conduction, a current path is completed from the center tap of the primary winding 16, through the diode 32, and to ground at the connection of the emitter of the diode 36. If the transistors 34,36 are complementary, such that only one conducts at a time, and the two are toggled back and forth with respect to conduction, current paths of opposite directions may be completed for the primary windings 16 of the associated transformers 12.

With a DC voltage V applied to the center tap of the primary winding 16 and with the circuit paths of the primary alternated as by mutually exclusively toggling the transistors 34,36, a pulsating current of alternating polarity can be caused to pass through the primary 16 and a corresponding AC current can be induced in the secondary winding 18. The associated bridge wire 20 is thereby energized by an AC current.

It will now be appreciated that the driver 38 is operative under programmer and decoder control to select the transistors 34,36 in pairs associated with a desired column in the matrix of transformers. With the driver 28 applying a voltage to the center tap of the primary 16 in a particular row, and with the driver 38 selecting the pair of transistors 34,36 of a particular column for toggled excitation, there is a single transformer 12 at the intersection of the row and column which has an AC current induced therein for bridge wire excitation.

The invention presented herein provides a totally solid state apparatus for energizing the bridge wires 20 of electro-explosive devices maintained in a cartridge matrix. The excitation is achieved by AC current, without mechanical switching, such that there is virtually no EMI. The bridge wire 20 of each of the electro-explosive devices is continuously grounded by interconnection with the grounded low impedance secondary windings 18. By proper utilization of a decoder under program control connected to the drivers 28,38, any one of the bridge wires 20 may be selected for energization. Yet further, the circuitry of the drawing is lightweight, relatively inexpensive, and reliable in operation.

While in accordance with the patent statutes only the best mode and preferred embodiment of the invention has been presented and described in detail, it is to be understood that the invention is not limited thereto or thereby. Consequently, for an appreciation of the true scope and breadth of the invention, reference should be had to the following claims.

What is claimed is:

1. A solid state switch, comprising:
   an array of transformers, each having a center-tap primary winding;
   a secondary winding associated with each said transformer in juxtaposition to said primary winding, each said secondary winding having a device for energization connected thereto;
   first means for applying a voltage source to the primary windings of a first selected group of said transformers;
   second means for completing a current path through the primary windings of a second selected group of transformers; and
   wherein said devices associated with transformers common to said first and second selected groups are energized.

2. The solid state switch according to claim 1 wherein said array comprises a matrix of transformers arranged in rows and columns.

3. The solid state switch according to claim 2 wherein said selected group of transformers are in a common row in said matrix and wherein said second selected group of transformers are in a common column in said matrix.

4. The solid state switch according to claim 3 wherein said first means comprises a plurality of switching circuits, are associated with each said row and connected in common to said center-tapped primary winding of all said transformers within said associated row.

5. The solid state switch according to claim 4 wherein said second means comprises pairs of switches, one such pair associated with each such column, one switch of such pair connected in common to one side of all primary windings in said associated column, and the other switch of said pair connected in common to an opposite side of all such primary windings.

6. The solid state switch according to claim 5 wherein the switches of each said pair are complementary, the output of one being the complement of the other.

7. The solid state switch according to claim 6 wherein said devices comprise bridge wires of electro-explosive devices, one interconnected across said secondary winding of each said transformer.

8. In an apparatus for energizing electroexplosive devices, the improvement comprising:
   a matrix of rows and columns of transformers, each having a center-tap primary winding and a second winding in inductive communication therewith;
   a bridge wire of a uniquely associated electro-explosive device connected across each said secondary winding;
   a plurality of first gating means, one connected in common to the center tap of said primary windings of all transformers in a common row, for selectively applying a voltage level to the center tap of all transformers in such row; and
   a plurality of second gating means, one connected in common across said primary windings of all transformers in a common column, for completing a current path through the associated primary windings.

9. The improvement as recited in claim 8 wherein said second gating means comprises a pair of complementary gates, one on each end of all primary windings in a column, alternating the direction of current flow in said primary windings.

10. The improvement as recited in claim 9 wherein the secondary windings of each said transformer are grounded.

* * * * *

UNITED STATES PATENT OFFICE
CERTIFICATE OF CORRECTION

Patent No. 4,399,752      Dated August 23, 1983

Inventor(s) John M. Bowyer; George W. Flower; Edward M. Maluke

It is certified that error appears in the above-identified patent and that said Letters Patent are hereby corrected as shown below:

Column 4, line 26, "are" should read --one--.

Signed and Sealed this

First Day of November 1983

[SEAL]

Attest:

GERALD J. MOSSINGHOFF

Attesting Officer      Commissioner of Patents and Trademarks